United States Patent
Chang et al.

(10) Patent No.: US 12,062,408 B2
(45) Date of Patent: *Aug. 13, 2024

(54) SWITCHES TO REDUCE ROUTING RAILS OF MEMORY SYSTEM

(71) Applicant: Taiwan Semiconductor Manufacturing Company, Ltd., Hsinchu (TW)

(72) Inventors: Meng-Sheng Chang, Chu-bei (TW); Chia-En Huang, Xinfeng Township (TW); Yi-Ching Liu, Hsinchu (TW); Yih Wang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/361,542

(22) Filed: Jul. 28, 2023

(65) Prior Publication Data

US 2024/0021220 A1    Jan. 18, 2024

Related U.S. Application Data

(63) Continuation of application No. 17/460,215, filed on Aug. 28, 2021, now Pat. No. 11,756,591.

(51) Int. Cl.
*G11C 5/06* (2006.01)

(52) U.S. Cl.
CPC .................. *G11C 5/063* (2013.01)

(58) Field of Classification Search
CPC ....... G11C 5/063; G11C 8/10; G11C 2207/005; G11C 7/12; G11C 7/18; G11C 5/025; G11C 8/12
USPC ........................................................... 365/63
See application file for complete search history.

(56) References Cited

U.S. PATENT DOCUMENTS

| | | | |
|---|---|---|---|
| 11,374,018 B2 | 6/2022 | Yeh et al. | |
| 11,756,591 B2* | 9/2023 | Chang | G11C 7/18 365/63 |
| 2016/0086671 A1* | 3/2016 | Lee | G11C 16/24 365/185.11 |
| 2018/0197590 A1 | 7/2018 | Lee | |
| 2021/0091108 A1 | 3/2021 | Naruke et al. | |

* cited by examiner

*Primary Examiner* — Huan Hoang
(74) *Attorney, Agent, or Firm* — FOLEY & LARDNER LLP

(57) ABSTRACT

Disclosed herein are related to a memory array including a set of memory cells and a set of switches to configure the set of memory cells. In one aspect, each switch is connected between a corresponding local line and a corresponding subset of memory cells. The local clines may be connected to a global line. Local lines may be metal rails, for example, local bit lines or local select lines. A global line may be a metal rail, for example, a global bit line or a global select line. A switch may be enabled or disabled to electrically couple a controller to a selected subset of memory cells through the global line. Accordingly, the set of memory cells can be configured through the global line rather than a number of metal rails to achieve area efficiency.

18 Claims, 11 Drawing Sheets

SWITCHES TO REDUCE ROUTING RAILS OF MEMORY SYSTEM

CROSS-REFERENCE TO RELATED APPLICATION

This application is a continuation application of U.S. patent application Ser. No. 17/460,215, filed on Aug. 28, 2021, which is incorporated herein by reference in its entirety for all purposes.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
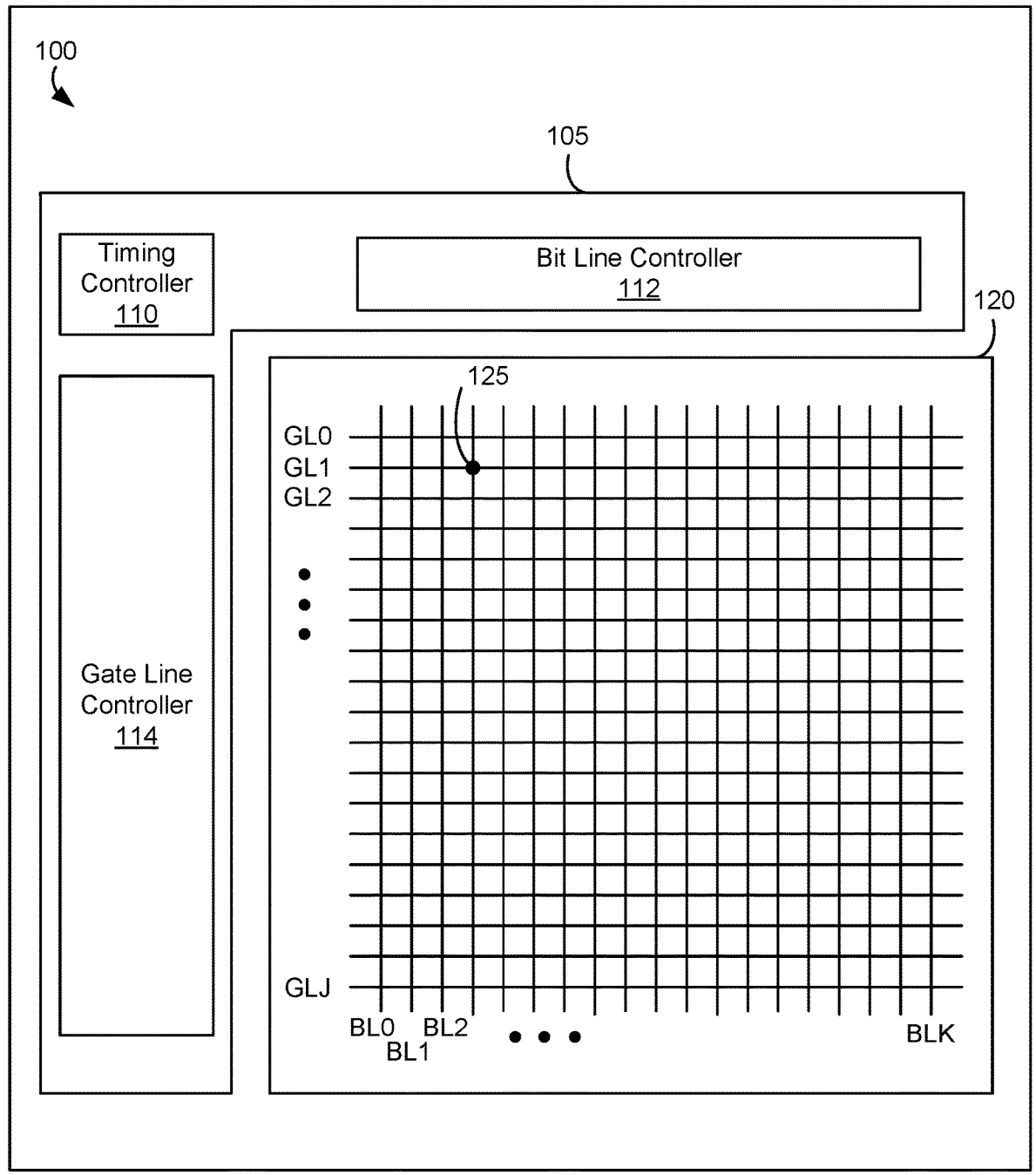
FIG. 1 is a diagram of a memory system, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes switches to couple or decouple local lines to a global line. A local line may be a metal rail to which two or more memory cells are connected. For example, a local line may be a local select line to which first electrodes (e.g., drain (or source) electrodes) of memory cells are connected. For example, a local line may be a local bit line to which second electrodes (e.g., source (or drain) electrodes) of the memory cells are connected. A global line may be a metal rail to which one or more of selected local lines can be electrically coupled through switches. For example, a global line may be a global select line to which two or more local select lines can be electrically coupled through switches. For example, a global line may be a global bit line to which two or more local bit lines can be electrically coupled through switches.

Advantageously, the memory system employing the disclosed switches can achieve several benefits. The switches can electrically couple or decouple respective local lines to the global line selectively. By coupling a selected local line to a global line, a subset of a set of memory cells connected to the selected local line can be electrically coupled to the global line while the other subset of the set of memory cells connected to unselected local lines can be electrically decoupled from the global line. In one aspect, a memory system may configure or operate the switches, and apply a voltage or current to the selected subset of memory cells through the global line. Hence, a fewer number of global lines or metal rails can be employed between the memory array and the memory controller to achieve area efficiency. Moreover, operating speed of the memory system can be improved by obviating capacitive loads of large number of metal rails between the memory controller and the memory array.

FIG. 1 is a diagram of a memory system 100, in accordance with one embodiment. In some embodiments, the memory system 100 is implemented as an integrated circuit. In some embodiments, the memory system 100 includes a memory controller 105 and a memory array 120. The memory array 120 may include a plurality of storage circuits or memory cells 125 arranged in two- or three-dimensional arrays. Each memory cell 125 may be connected to a corresponding gate line GL and a corresponding bit line BL. Each gate line GL may include any conductive material. The memory controller 105 may write data to or read data from the memory array 120 according to electrical signals through gate lines GL and bit lines BL. In other embodiments, the memory system 100 includes more, fewer, or different components than shown in FIG. 1.

The memory array 120 is a hardware component that stores data. In one aspect, the memory array 120 is embodied as a semiconductor memory device. The memory array 120 includes a plurality of storage circuits or memory cells 125. In some embodiments, the memory array 120 includes gate lines GL0, GL1 . . . GLJ, each extending in a first direction and bit lines BL0, BL1 . . . BLK, each extending in a second direction. The gate lines GL and the bit lines BL may be conductive metals or conductive rails. Each gate line GL may include a word line and control lines. In one aspect, each memory cell 125 is connected to a corresponding gate line GL and a corresponding bit line BL, and can be operated according to voltages or currents through the corresponding gate line GL and the corresponding bit line BL. In one aspect, each memory cell 125 may be a non-volatile memory cell. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112, a gate line controller 114, and a timing controller 110. In one configuration, the gate line controller 114 is a circuit that provides a voltage or a current through one or more gate lines GL of the memory array 120. In one aspect, the bit line controller 112 is a circuit that provides a voltage or current through one or more bit lines BL of the memory array 120 and senses a voltage or current from the memory array 120 through one or more select lines. In one configuration, the timing controller 110 is a circuit that provides control signals or clock signals to the gate line controller 114 and the bit line controller 112 to synchronize operations of the bit line controller 112 and the gate line controller 114. The bit line controller 112 may be connected to bit lines BL and select lines of the memory array 120, and the gate line controller 114 may be connected to gate lines GL of the memory array 120. In one example, to write data to a memory cell 125, the gate line controller 114 applies a voltage or current to the memory cell 125 through a gate line GL connected to the memory cell 125, and the bit line controller 112 applies a voltage or current corresponding to data to be stored to the memory cell 125 through a bit line BL connected to the memory cell 125. In one example, to read data from a memory cell 125, the gate line controller 114 applies a voltage or a current to the memory cell 125 through a gate line GL connected to the memory cell 125, and the bit line controller 112 senses a voltage or current corresponding to data stored by the memory cell 125 through a select line or a bit line connected to the memory cell 125. In some embodiments, the memory controller 105 includes more, fewer, or different components than shown in FIG. 1.

Figure 2:
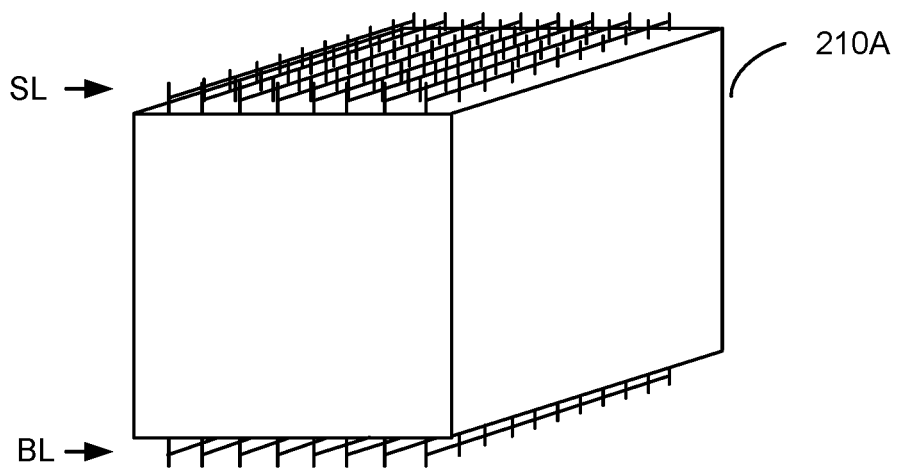
FIG. 2 is a diagram showing three-dimensional memory arrays, in accordance with one embodiment.
Figure 2:
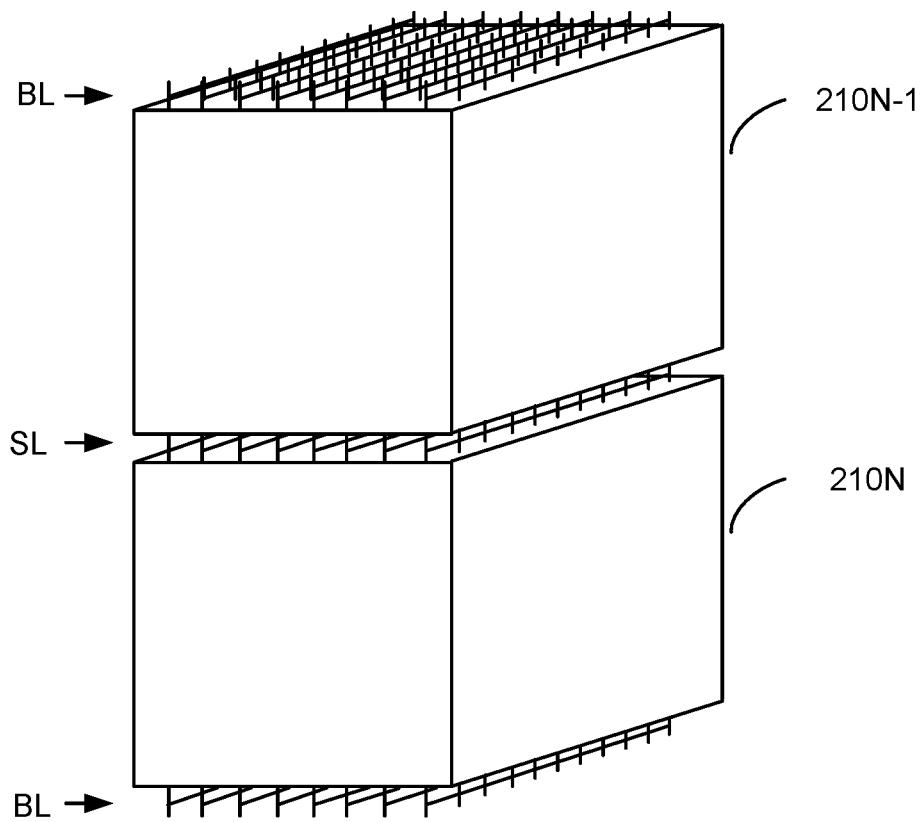

FIG. 2 is a diagram showing three-dimensional memory arrays 210A . . . 210N, in accordance with one embodiment. In some embodiments, the memory array 120 includes the memory arrays 210A . . . 210N. Each memory array 210 includes a plurality of memory cells 125 arranged in a three-dimensional array. In some embodiments, each memory array 210 may include a same number of memory cells 125. In some embodiments, two or more memory arrays 210 may include different numbers of memory cells 125. In one configuration, the memory arrays 210A . . . 210N are stacked along a Z-direction. Each memory array 210 may have bit lines BL on one side of the memory array 210 and have select lines SL on an opposite side of the memory array 210. In some embodiments, two adjacent memory arrays 210 may share select lines SL. In some embodiments, two adjacent memory arrays 210 may share bit lines BL. For example, memory arrays 210N-1, 210N share or are electrically coupled to a set of select lines SL. For example, memory arrays 210N-2, 210N-1 share or are electrically coupled to a set of bit line BL. By sharing select lines SL and/or bit lines BL, a number of drivers of the memory controller 105 to apply signals through the select lines SL and/or bit lines BL can be reduced to achieve area efficiency. In some embodiments, the memory array 120 includes additional memory arrays that may have separate select lines SL and/or bit lines BL than shown in FIG. 2.

Figure 3:
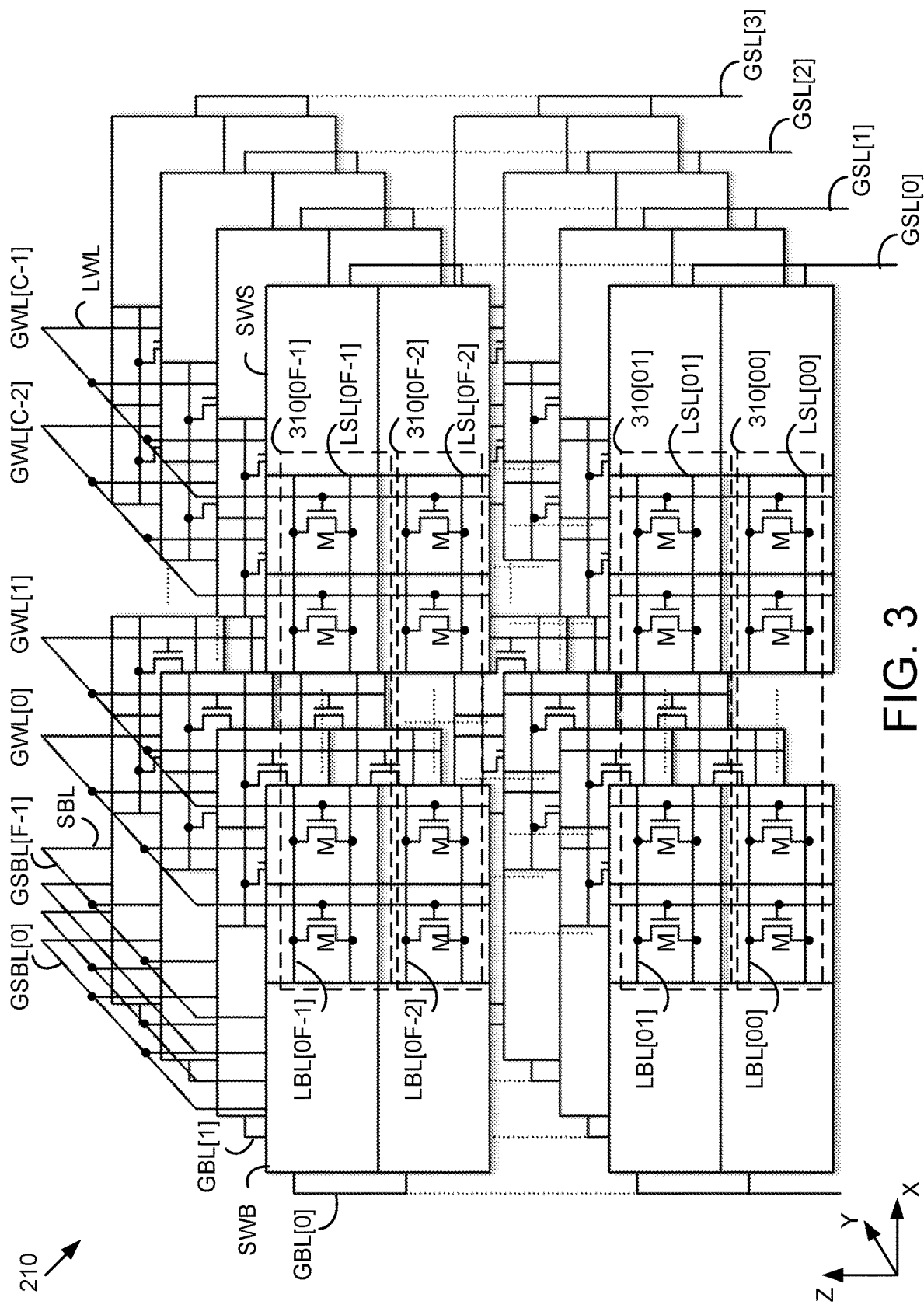
FIG. 3 is a diagram showing a three-dimensional memory array including switch banks, in accordance with one embodiment.

FIG. 3 is a diagram showing a portion of a three-dimensional memory array 210 including switch banks SWB, SWS to reduce routing between the memory array 210 and the memory controller 105, in accordance with one embodiment. In FIG. 3, the memory array 210 includes a set of memory cells including subsets 310[Y0] . . . 310[YF-1] of memory cells that may be electrically coupled to a global bit line GBL[Y] and a global select line GSL[Y] extending along a Z-direction. For example, a first set of memory cells includes subsets 310[00] . . . 310[0F-1] of memory cells that may be electrically coupled to a global bit line GBL[0] and a global select line GSL[0]. Each subset 310 of memory cells may include C number of memory cells M (memory cell 125) disposed along the X-direction. Each set of memory cells may include a larger number of subsets 310 of memory cells than shown in FIG. 3 along the Z-direction. The memory array 210 may include a larger number of sets of memory cells than shown in FIG. 3 stacked along the Y-direction. By arranging memory cells as shown in FIG. 3, a storage density of the memory array 210 can be increased.

In one configuration, each subset 310 of memory cells includes C number of memory cells M disposed along the X-direction. Each memory cell M may be a volatile memory cell, a non-volatile memory cell, or any memory cell that can store data. Each memory cell M may be embodied as a transistor (e.g., MOSFET, GAAFET, FinFET, etc.). Each memory cell M may include a first electrode (e.g., drain electrode) coupled to a local select line LSL, a second electrode (e.g., source electrode) coupled to a local bit line LBL, and a third electrode (e.g., gate electrode) coupled to a corresponding local word line LWL. Each memory cell M may store data or conduct current according to a voltage applied to a gate electrode of the memory cell M. A local word line LWL may extend along the Z-direction to connect gate electrodes of corresponding memory cells M in different subsets to a global word line GWL. The global word line GWL may be a metal rail, to which corresponding local word lines LWL can be connected. The global word line GWL may extend along the Y-direction. The global word line GWL may be connected to the memory controller 105 (e.g., gate line controller 114). In one configuration, a subset 310 of memory cells M are connected in parallel between a local select line LSL and a local bit line LBL. A local select line LSL may be a metal rail, to which first electrodes (e.g., drain electrodes) of a subset 310 of memory cells are connected. A local bit line LBL may be a metal rail, to which second electrodes (e.g., source electrodes) of a subset 310 of memory cells are connected. The local select line LSL may extend along the X-direction and connect to a corresponding switch bank SWS. Similarly, the local bit line LBL may extend along the X-direction and connect to a corresponding switch bank SWB.

In one configuration, a switch bank SWB is a circuit including a set of switches that can electrically couple a global bit line GBL to a selected local bit line LBL, selectively. In one aspect, a switch bank SWB may include, for each subset 310[YZ] of memory cells, one or more switches connected between the global bit line GBL[Y] and a corresponding local bit line LBL[YZ], to which the subset 310[YZ] of memory cells is connected. The switch bank SWB may be connected to F number of local switch control lines SBL[0] . . . SBL[F-1] extending along the Z-direction. The local switch control lines SBL[0] . . . SBL[F-1] may be metal rails, to which gate electrodes of switches of the switch bank SWB can be connected. Each local switch control line SBL may be connected to a corresponding global switch control line GSBL extending along the Y-direction. A global switch control line GSBL[Z] may be a metal rail, to which corresponding local switch control lines SBL disposed along the Y-direction in parallel can be connected. The global switch control lines GSBL[0] . . . GSBL[F-1] can be connected to the memory controller 105 (e.g., gate line controller 114). According to signals applied through the global switch control lines GSBL, the switch bank SWB can be configured to couple a global bit line GBL to a selected local bit line LBL. According to a voltage or current applied through the global bit line GBL, a subset of memory cells connected to the selected local bit line LBL can be configured.

In one configuration, a switch bank SWS is a circuit including a set of switches that can electrically couple a global select line GSL to a selected local select line LSL, selectively. In one aspect, a switch bank SWS may include, for each subset 310[YZ] of memory cells, one or more switches connected between the global select line GSL[Y] and a corresponding local select line LSL[YZ], to which the subset 310[YZ] of memory cells is connected. The switch bank SWS may be connected to F number of local switch control lines SSL[0] . . . SSL[F-1] (not shown in FIG. 3) extending along the Z-direction. The local switch control lines SSL[0] . . . SSL[F-1] may be metal rails, to which gate electrodes of switches of the switch bank SWS can be connected. Each local switch control line SSL may be connected to a corresponding global switch control line GSSL (not shown in FIG. 3) extending along the Y-direction. A global switch control line GSSL[Z] may be a metal rail, to which corresponding local switch control lines SSL disposed along the Y-direction in parallel can be connected. The global switch control lines GSSL[0] . . . GSSL[F-1] can be connected to the memory controller 105 (e.g., gate line controller 114). According to signals applied through the global switch control lines GSSL, the switch bank SWS can be configured to couple a global select line GSL to a selected local select line LSL. According to a voltage or current applied through the global select line GSL, a subset of memory cells connected to the selected local select line LSL can be configured.

In one configuration, the global select lines GSL are metal rails, to which the switch banks SWS are connected. The global select lines GSL may extend along the Z-direction. In one implementation, the global select lines GSL may be connected to a memory controller 105 (e.g., bit line controller 112). The global bit lines GBL are metal rails, to which the switch banks SWB are connected. The global bit lines GBL may extend along the Z-direction in parallel with the global select lines GSL. In one implementation, the global bit lines GBL may be connected to the memory controller 105 (e.g., bit line controller 112).

In one configuration, the switch banks SWB, SWS can be operated or configured according to a voltage or signal from the memory controller 105 (e.g., gate line controller 114) to electrically couple a subset 310 of memory cells to corresponding global lines GBL, GSL selectively. For example, from a set 310[Y0] . . . 310[YF-1] of memory cells connected to local select lines LSL[Y0] . . . LSL[YF-1] and local bit lines LBL[Y0] . . . LBL[YF-1], a subset 310[YZ] of memory cells connected to a local select line LSL[YZ] and a local bit line LBL[YZ] can be electrically coupled to the global bit line GBL[Y] and the global select line GSL[Y] through selected switches of the switch banks SWB, SWS. Meanwhile, other subsets 310 of memory cells connected to other local select lines LSL and local bit lines LBL can be electrically decoupled from the global bit line GBL[Y] and the global select line GSL[Y]. By electrically coupling a selected subset 310[YZ] of memory cells to the global bit line GBL[Y] and the global select line GSL[Y] through the switch banks SWB, SWS, the global bit line GBL[Y] and the global select line GSL[Y] may have a capacitive loading corresponding to the selected subset 310[YZ] of memory cells instead of the set 310[Y0] . . . 310[YF-1] of memory cells. Accordingly, the global bit lines GBL and the global select lines GSL may be implemented to provide voltages or current with reduced capacitive loading. By reducing capacitive loading, memory cells M can be operated or configured with improved speed and lower power consumption. Moreover, the memory array 210 can achieve area efficiency by implementing a fewer number of global lines GBL, GSL than local lines LSL, LBL for routing between the memory cells and the memory controller 105.

Figure 4:
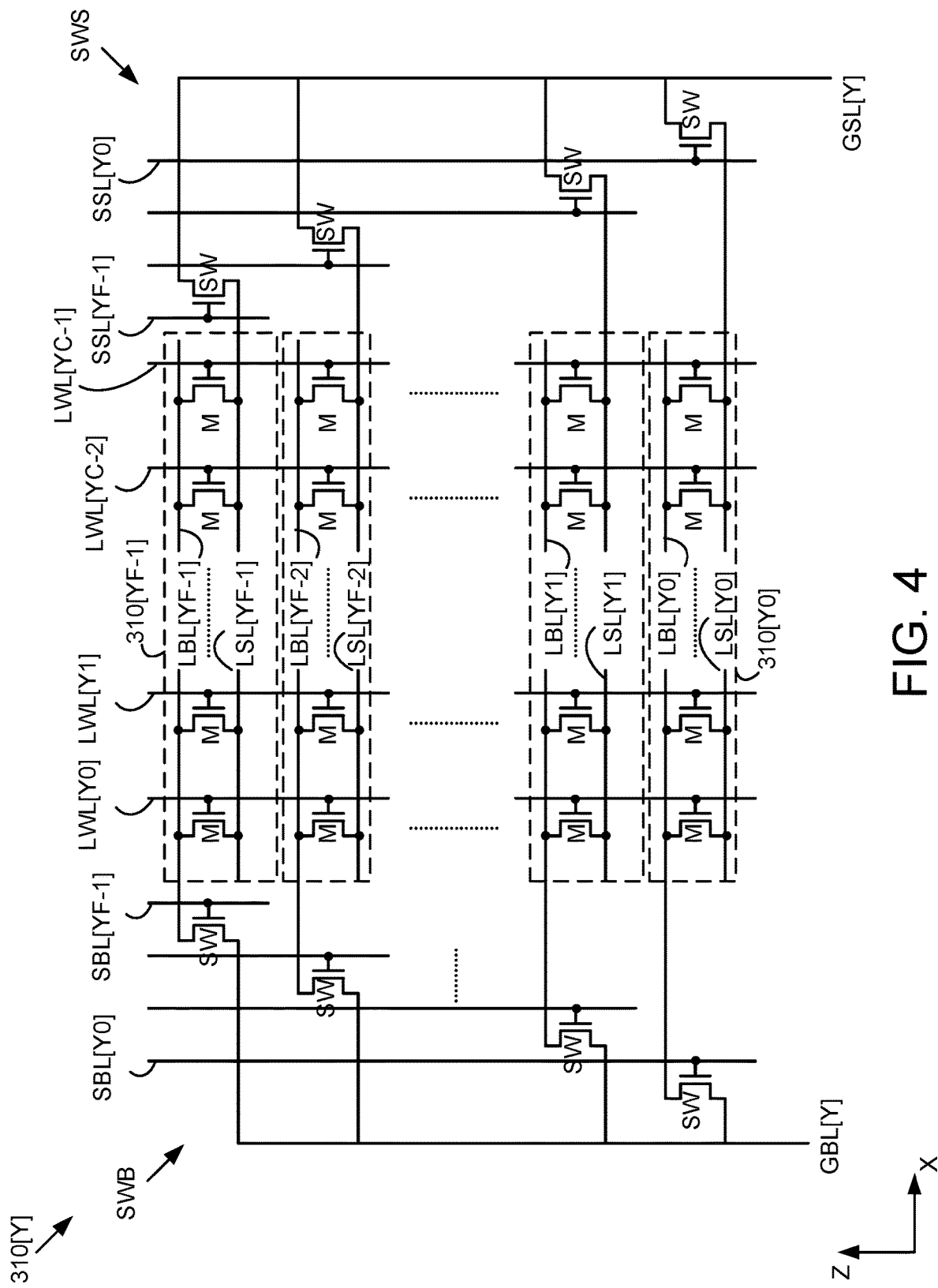
FIG. 4 is a diagram showing a set of memory cells and two switch banks connected to the set of memory cells, in accordance with one embodiment.

FIG. 4 is a diagram showing a set 310[Y] of memory cells including subsets 310[Y0] . . . 310[YF-1] and switch banks SWB, SWS, in accordance with one embodiment. In some embodiments, the subsets 310[Y0] . . . 310[YF-1] are disposed between the switch banks SWB, SWS along the X-direction.

The switch bank SWB may include a set of switches SW. Each switch SW may be embodied as a transistor (e.g., MOSFET, GAAFET, FinFET, etc.). The switch bank SWB may include a switch SW connected to a corresponding subset 310[YZ] of memory cells. Each switch SW may include a first electrode (e.g., drain electrode) connected to the local bit line LBL, a second electrode (e.g., source electrode) connected to a corresponding global bit line GBL, and a third electrode (e.g., gate electrode) connected to a corresponding switch control line SBL. The switch control line SBL may be a metal rail extending along the Z-direction connected to a gate electrode of a switch SW in the switch bank SWB. In one aspect, a switch control line SBL is connected to a global switch control line GSBL extending along the Y-direction. According to a voltage or a signal applied through the local switch control line SBL, a switch SW in the switch bank SWB connected to the local switch control line SBL may be enabled or disabled. For example, in response to a voltage corresponding to logic state '1' provided through the local switch control line SBL[YZ], a switch SW in the switch bank SWB may be enabled to electrically couple second electrodes (e.g., source electrodes) of the subset 310[YZ] of memory cells to the global bit line GBL[Y]. For example, in response to a voltage corresponding to logic state '0' provided through the switch control line SBL[YZ], the switch SW in the switch bank SWB may be disabled to electrically decouple second electrodes (e.g., source electrodes) of the subset 310[YZ] of memory cells from the global bit line GBL[Y].

The switch bank SWS may include a set of switches SW. Each switch SW may be embodied as a transistor (e.g., MOSFET, GAAFET, FinFET, etc.). The switch bank SWS may include a switch SW connected to a corresponding subset 310[YZ] of memory cells. Each switch SW may include a first electrode (e.g., source electrode) connected to the local select line LSL, a second electrode (e.g., drain electrode) connected to a corresponding global select line GSL, and a third electrode (e.g., gate electrode) connected to a corresponding switch control line SSL. The switch control line SSL may be a metal rail extending along the Z-direction connected to a gate electrode of a switch SW in the switch bank SWS. In one aspect, a switch control line SSL is connected to a global switch control line GSSL extending along the Y-direction. According to a voltage or a signal applied through the local switch control line SSL, one or more switches SW in the switch bank SWS connected to the local switch control line SSL may be enabled or disabled. For example, in response to a voltage corresponding to logic state '1' provided through the local switch control line SSL[YZ], a switch SW in the switch bank SWS may be enabled to electrically couple first electrodes (e.g., drain electrodes) of the subset 310[YZ] of memory cells to the global select line GSL[Y]. For example, in response to a voltage corresponding to logic state '0' provided through the switch control line SSL[YZ], the switch SW in the switch bank SWS may be disabled to electrically decouple first electrodes (e.g., drain electrodes) of the subset 310[YZ] of memory cells from the global select line GSL[Y].

Figure 5:
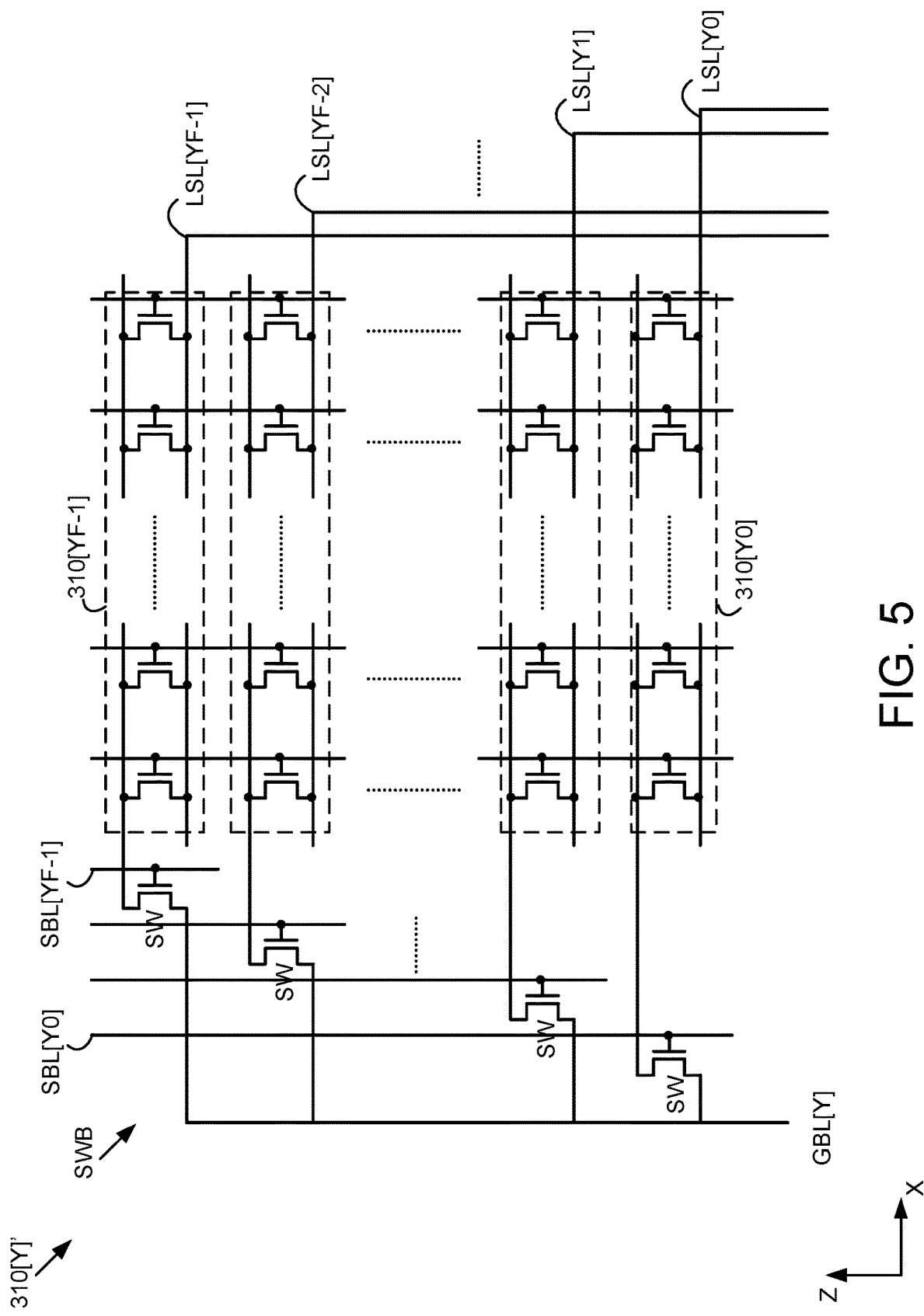
FIG. 5 is a diagram showing a set of memory cells and a switch bank connected to the set of memory cells, in accordance with one embodiment.

FIG. 5 is a diagram showing a set 310[Y]' of memory cells including subsets 310[Y0] . . . 310[YF-1] and a switch bank SWB, in accordance with one embodiment. In one aspect, the set 310[Y]' of memory cells shown in FIG. 5 is similar to the set 310[Y] in FIG. 4, except the switch bank SWS is omitted. Thus, detailed description of duplicated portion thereof is omitted herein for the sake of brevity. In some embodiments, the local select lines LSL[Y0] . . . LSL[YF-1] can extend, for example, along the Z-direction and connect to the memory controller 105 (e.g., bit line controller 112). By configuring switches SW in the switch bank SWB, the memory controller 105 may electrically couple to a selected subset 310 of memory cells through a global bit line GBL to configure the selected subset 310 of memory cells.

Figure 6:
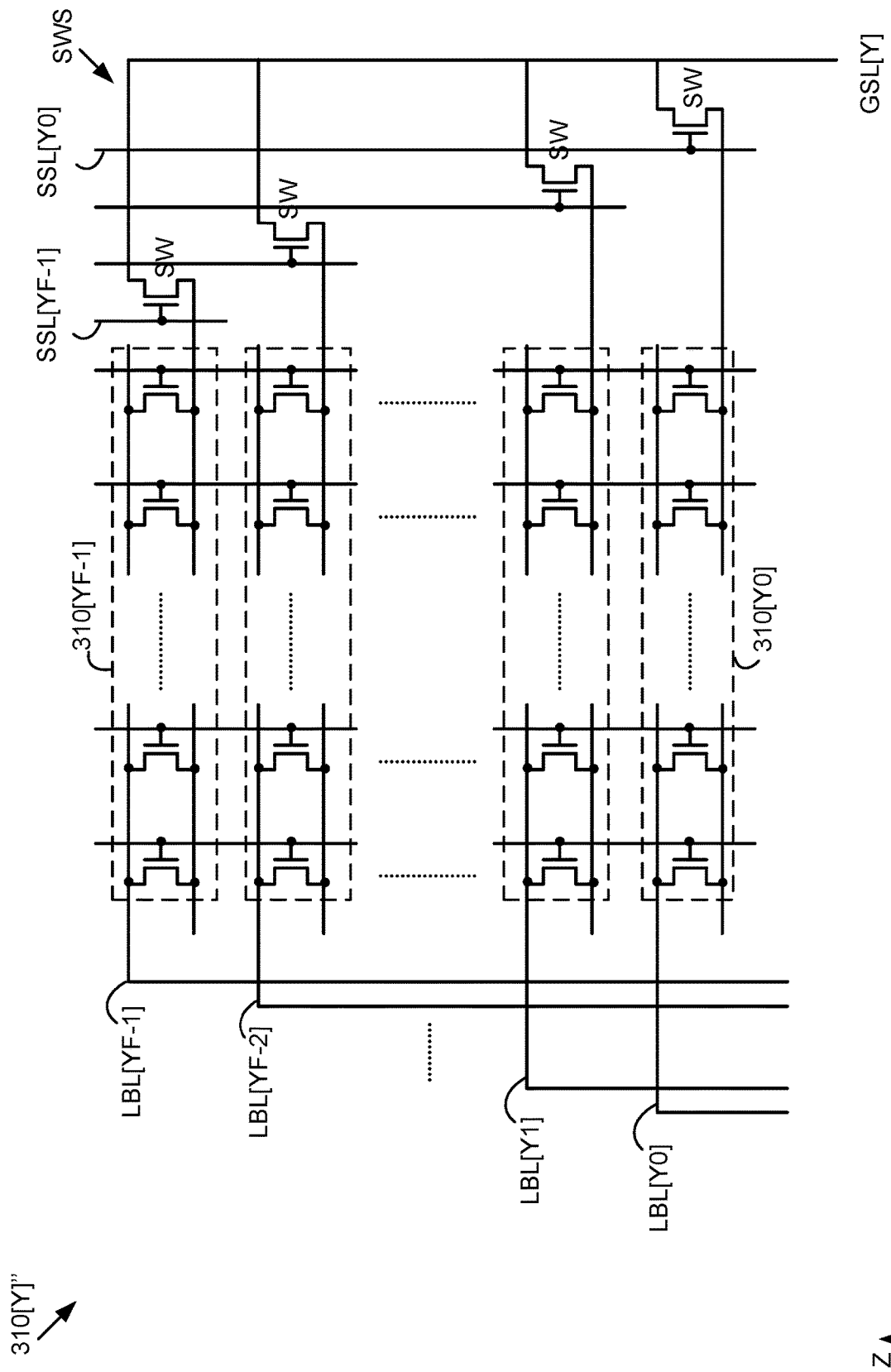
FIG. 6 is a diagram showing a set of memory cells and a switch bank connected to the set of memory cells, in accordance with one embodiment.

FIG. 6 is a diagram showing a set 310[Y]" of memory cells including subsets 310[Y0] . . . 310[YF-1] and a switch bank SWS, in accordance with one embodiment. In one aspect, the set 310[Y]" of memory cells shown in FIG. 6 is similar to the set 310[Y] in FIG. 4, except the switch bank SWB is omitted. Thus, detailed description of duplicated portion thereof is omitted herein for the sake of brevity. In some embodiments, the local bit lines LBL[Y0] . . . LBL[YF-1] can extend, for example, along the Z-direction and connect to the memory controller 105 (e.g., bit line controller 112). By configuring switches SW in the switch bank SWS, the memory controller 105 may electrically couple to a selected subset 310 of memory cells through a global select line GSL to configure the selected subset 310 of memory cells.

Figure 7:
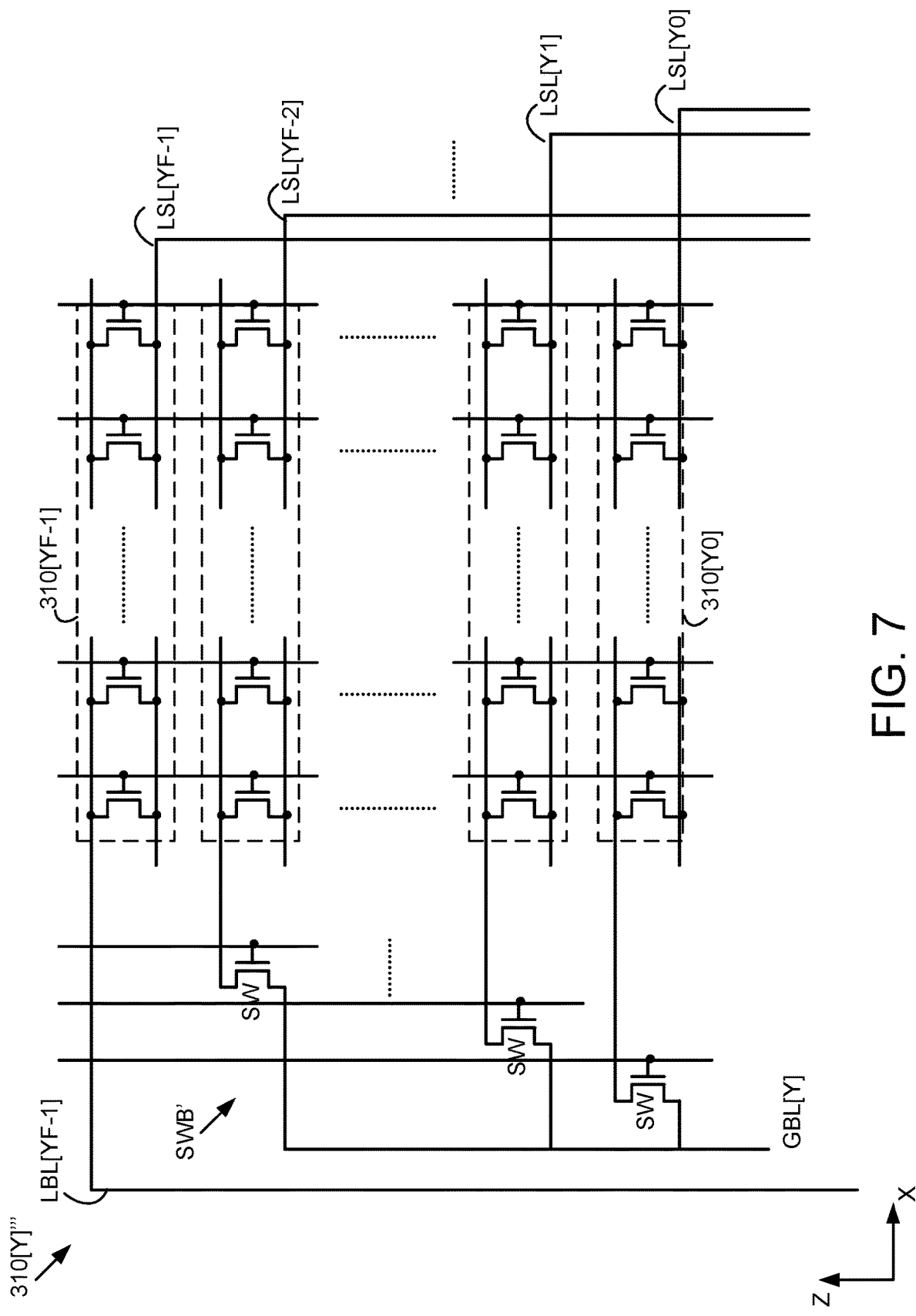
FIG. 7 is a diagram showing a set of memory cells and a switch bank connected to the set of memory cells, in accordance with one embodiment.

FIG. 7 is a diagram showing a set 310[Y]'" of memory cells including subsets 310[Y0] . . . 310[YF-1] and a switch bank SWB', in accordance with one embodiment. In one aspect, the set 310[Y]'" of memory cells shown in FIG. 7 is similar to the set 310[Y]' in FIG. 5, except the switch bank SWB' is implemented instead of the switch bank SWB. Thus, detailed description of duplicated portion thereof is omitted herein for the sake of brevity. In one aspect, the switch bank SWB' lacks or omits a switch SW for the subset 310[YF-1] of memory cells. In some embodiments, the local bit line LBL[YF-1] may extend along the Z-direction and connect to the memory controller 105 (e.g., bit line controller 112). By connecting the local bit line LBL[YF-1] to the memory controller 105 separate from the global bit line GBL[Y], the subset 310[YF-1] of memory cells may be configured or operated separately or independently from the other subsets 310 of memory cells. For example, one or more memory cells of subset 310[YF-1] of memory cells can be configured or operated through the local bit line LBL[YF-1], while one or more memory cells of another subset 310[Y0] of memory cells can be configured or operated through the global bit line GBL[Y].

Figure 8:
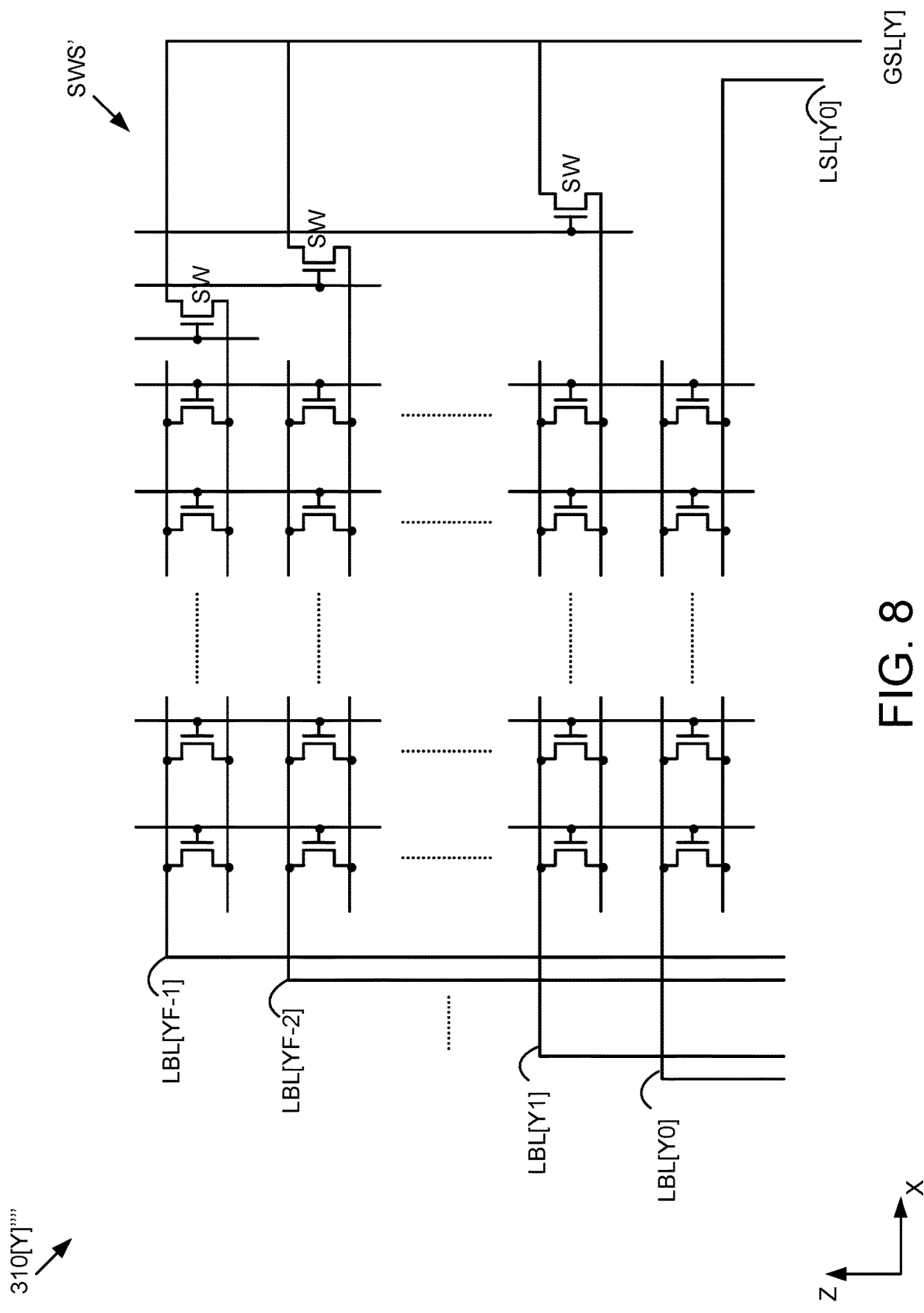
FIG. 8 is a diagram showing a set of memory cells and a switch bank connected to the set of memory cells, in accordance with one embodiment.

FIG. 8 is a diagram showing a set 310[Y]"" of memory cells including subsets 310[Y0] . . . 310[YF-1] and a switch bank SWS', in accordance with one embodiment. In one aspect, the set 310[Y]"" of memory cells shown in FIG. 8 is similar to the set 310[Y]" in FIG. 6, except the switch bank SWS' is implemented instead of the switch bank SWS. Thus, detailed description of duplicated portion thereof is omitted herein for the sake of brevity. In one aspect, the switch bank SWS' lacks or omits a switch SW for the subset 310[Y0] of memory cells. In some embodiments, the local select line LSL[Y0] may extend along the Z-direction and connect to the memory controller 105 (e.g., bit line controller 112). By connecting the local select line LSL[Y0] to the memory controller 105 separate from the global select line GSL[Y], the subset 310[Y0] of memory cells may be configured or operated separately or independently from the other subsets 310 of memory cells. For example, one or more memory cells of subset 310[Y0] of memory cells can be configured or operated through the local select line LSL[Y0], while one or more memory cells of another subset 310[YF-1] of memory cells can be configured or operated through the global select line GSL[Y].

Figure 9:
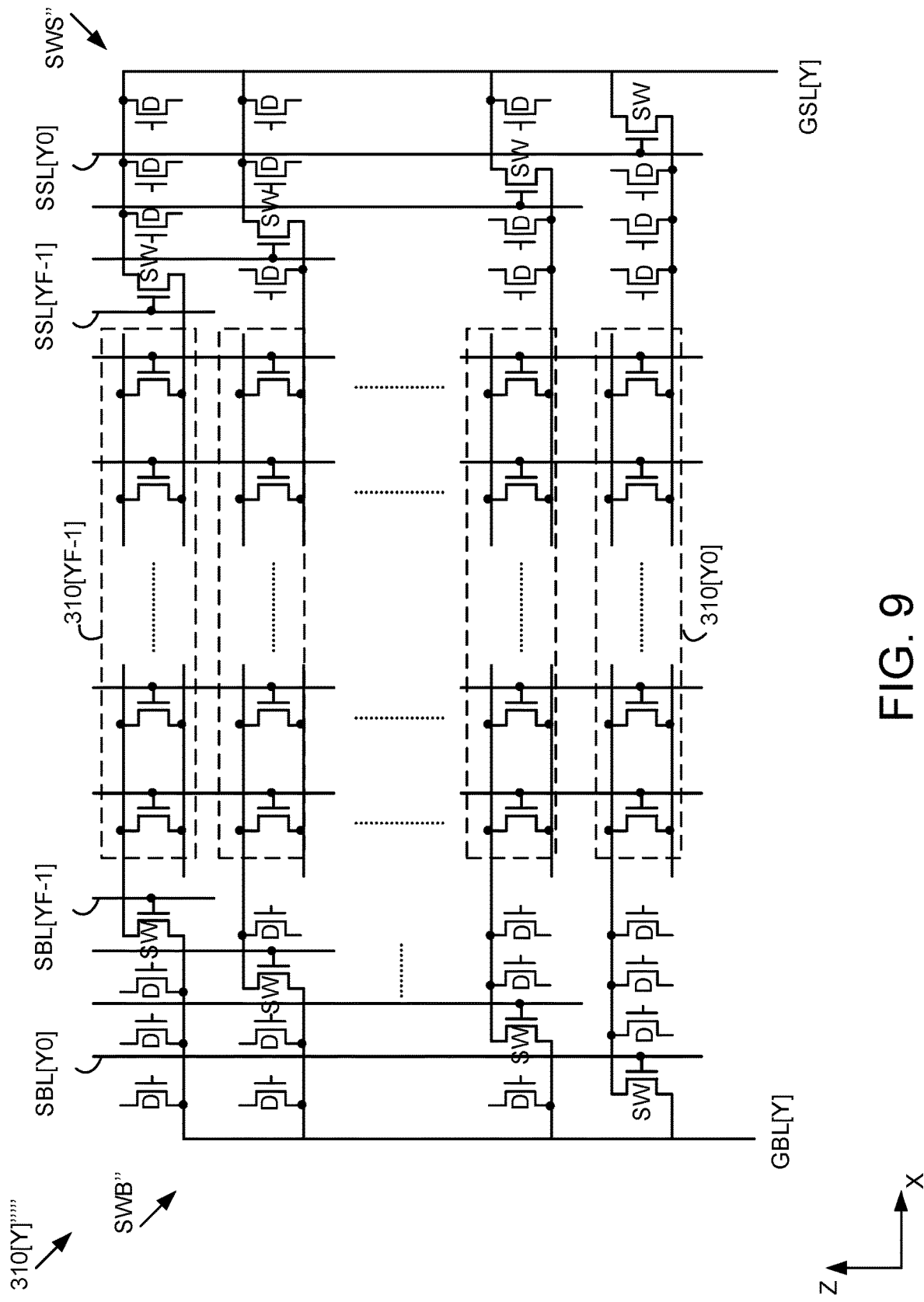
FIG. 9 is a diagram showing a set of memory cells and switch banks connected to the set of memory cells, in accordance with one embodiment.

FIG. 9 is a diagram showing a set 310[Y]""' of memory cells including subsets 310[Y0] . . . 310[YF-1] and switch banks SWB", SWS", in accordance with one embodiment. In one aspect, the switch banks SWB", SWS" includes dummy transistors or dummy switches D. In one configuration, the switch banks SWB", SWS" include, for each subset 310[YZ] of memory cells, a corresponding set of dummy switches disposed along the X-direction. Each dummy switch D may include at least one electrode (e.g., source electrode or drain electrode) that is electrically floated. A local bit lines SBL may extend over one or more dummy switches D in the switch bank SWB". Similarly, a local select lines SSL may extend over one or more dummy switches D in the switch bank SWS". By implementing the dummy switches D, the switches SW can be implemented in a more consistent manner with less variation.

Figure 10:
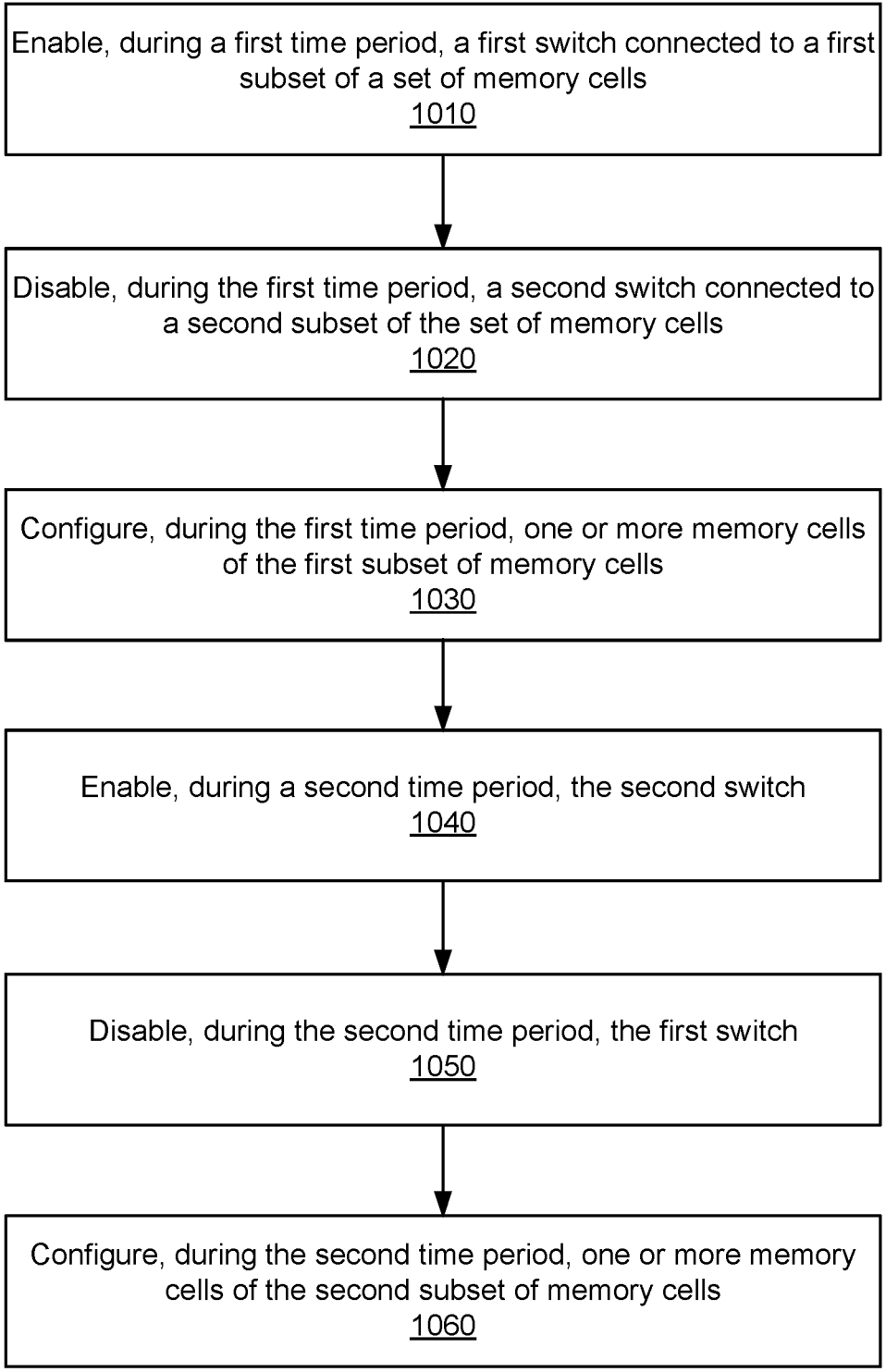
FIG. 10 is a flowchart showing a method of operating a memory cell, in accordance with some embodiments.

FIG. 10 is a flowchart showing a method 1000 of configuring or operating a memory cell (e.g., memory cell 125), in accordance with some embodiments. The method 1000 may be performed by the memory controller 105 of FIG. 1. In some embodiments, the method 1000 is performed by other entities. In some embodiments, the method 1000 includes more, fewer, or different operations than shown in FIG. 10.

In an operation 1010, the memory controller 105 enables, during a first time period, a first switch SW connected to a first subset (e.g., 310[00]) of a set (e.g., 310[00] . . . 310[03]) of memory cells. The memory controller 105 may apply a first signal having the first state (e.g., logic value '1') to the global switch control line GSBL coupled to the gate electrode of the first switch SW during the first time period to enable the first switch during the first time period. By enabling the first switch, the first subset of memory cells may be electrically coupled to a global line. For example, switches SW connected to the subset 310[00] of memory cells may be enabled, such that the subset 310[00] of memory cells can be electrically coupled to the global bit line GBL[0] and the global select line GSL[0] during the first time period.

In an operation 1020, the memory controller 105 disables, during the first time period, a second switch SW connected to a second subset (e.g., 310[01] of the set (e.g., 310[00] . . . 310[03]) of memory cells. The memory controller 105 may apply a second signal having the second state (e.g., logic value '0') to the global switch control line GSBL coupled to the gate electrode of the second switch SW during the second time period to disable the second switch during the first time period. By disabling the second switch, the second subset of memory cells may be electrically decoupled from the global line. For example, switches SW connected to the subset 310[01] of memory cells may be disabled, such that the subset 310[01] of memory cells can be electrically decoupled from the global bit line GBL[0] and the global select line GSL[0] during the first time period. In one approach, the memory controller 105 may disable switches SW connected to other subsets (e.g., 310[02], 310[03]) of the set (e.g., 310[00] . . . 310[03]) of memory cells, such that the global line (e.g., GBL[0], GSL[0]) has a capacitive loading corresponding to the first subset (e.g., 310[00]) of memory cells instead of the entire set (e.g., 310[00] . . . 310[03]) of memory cells.

In an operation 1030, the memory controller 105 configures, during the first time period, one or more memory cells of the first subset (e.g., 310[00]) of memory cells. For example, the memory controller 105 may apply a voltage, current, or pulse to one or more memory cells through word lines to program the one or more memory cells or cause the one or more memory cells to conduct current according to the programmed data. In one approach, the memory controller 105 may apply the voltage, current, or pulses to other memory cells in unselected subsets (e.g., 310[01] . . . 310[03]) of memory cells. Because the switches SW connected to the unselected subsets of memory cells are electrically decoupled from the global lines GBL, GSL, the memory cells in the unselected subsets may not be programmed or may not conduct current despite the voltage, current, or pulses applied. Hence, memory cells in the selected subset (e.g., 310[00]) of memory cells can be configured.

In one approach, the memory controller 105 may enable, during the first time period, a third switch SW connected to a third subset (e.g., 310[10]) of a set (e.g., 310[10] . . . 310[13]) of memory cells. The memory controller 105 may disable, during the first time period, a fourth switch SW connected to a fourth subset (e.g., 310[11]) of the set (e.g., 310[10] . . . 310[13]) of memory cells. During the first time period, the memory controller 105 may disable other switches SW connected other subsets (e.g., 310[12], 310[13]) of the set of memory cells. By enabling the third switch connected to the third subset (e.g., 310[10]) of memory cells and disabling other switches connected to other subsets (e.g., 310[11] . . . 310[13]) of the set of memory cells (e.g., 310[10] . . . 310[13]), the global line (e.g., GBL[1], GSL[1]) may have a capacitive loading corresponding to the third subset (e.g., 310[10]) of memory cells instead of the entire set (e.g., 310[10] . . . 310[13]) of memory cells. Moreover, one or more memory cells of the third subset (e.g., 310[10]) of memory cells can be configured or operated, while one or more memory cells of the first subset (e.g., 310[00]) of memory cells are configured or operated through share word lines during the first time period.

In an operation 1040, the memory controller 105 enables, during a second time period, the second switch SW connected to the second subset (e.g., 310[01] of the set (e.g., 310[00] . . . 310[03]) of memory cells. The memory controller 105 may apply the second signal having the first state (e.g., logic value '1') to the global switch control line GSBL coupled to the gate electrode of the second switch SW during the second time period to enable the second switch during the second time period. By enabling the second switch, the second subset (e.g., 310[01]) of memory cells may be electrically coupled to the global line. For example, switches SW connected to the subset 310[01] of memory cells may be enabled, such that the subset 310[01] of memory cells can be electrically coupled to the global bit line GBL[0] and the global select line GSL[0] during the second time period.

In an operation 1050, the memory controller 105 disables, during the second time period, the first switch SW connected to the first subset (e.g., 310[00]) of the set (e.g., 310[00] . . . 310[03]) of memory cells. The memory controller 105 may apply the first signal having the second state (e.g., logic value '0') to the global switch control line GSBL coupled to the gate electrode of the first switch SW during the second time period to disable the first switch during the second time period. By disabling the first switch, the first subset (e.g., 310[00]) of memory cells may be electrically decoupled from the global line. For example, switches SW connected to the subset 310[00] of memory cells may be disabled, such that the subset 310[00] of memory cells can be electrically decoupled from the global bit line GBL[0] and the global select line GSL[0]. In one approach, the memory controller 105 may disable switches SW connected to other subsets (e.g., 310[02], 310[03]) of the set (e.g., 310[00] . . . 310[03]) of memory cells, such that the global line (e.g., GBL[0], GSL[0]) has a capacitive loading corresponding to the second subset (e.g., 310[01]) of memory cells instead of the entire set (e.g., 310[00] . . . 310[03]) of memory cells.

In an operation 1060, the memory controller 105 configures, during the second time period, one or more memory cells of the second subset (e.g., 310[01]) of memory cells. For example, the memory controller 105 may apply a voltage, current, or pulse to one or more memory cells through word lines to program the one or more memory cells or cause the one or more memory cells to conduct current according to the programmed data. In one approach, the memory controller 105 may apply the voltage, current, or pulses to other memory cells in unselected subsets (e.g., 310[00], 310[02] . . . 310[03]) of memory cells. Because the switches SW connected to the unselected subsets of memory cells are electrically decoupled from the global lines GBL, GSL, the memory cells in the unselected subsets may not be programmed or may not conduct current despite the voltage, current, or pulses applied through word lines. Hence, memory cells in the selected subset (e.g., 310[01] of memory cells can be configured.

In one approach, the memory controller 105 may enable, during the second time period, the fourth switch SW connected to the fourth subset (e.g., 310[11]) of the set (e.g., 310[10] . . . 310[13]) of memory cells. The memory controller 105 may disable, during the second time period, the third switch SW connected to the third subset (e.g., 310[10]) of the set (e.g., 310[10] . . . 310[13]) of memory cells. During the second time period, the memory controller 105 may disable other switches SW connected other subsets (e.g., 310[12], 310[13]) of the set of memory cells. By enabling the fourth switch connected to the fourth subset (e.g., 310[11]) of memory cells and disabling other switches connected to other subsets (e.g., 310[10], 310[12] . . . 310[13]) of the set of memory cells (e.g., 310[10] . . . 310[13]), the global line (e.g., GBL[1], GSL[1]) may have a capacitive loading corresponding to the fourth subset (e.g., 310[11]) of memory cells instead of the entire set (e.g., 310[10] . . . 310[13]) of memory cells. Moreover, one or more memory cells of the fourth subset (e.g., 310[11]) of memory cells can be configured or operated, while one or more memory cells of the second subset (e.g., 310[01]) of memory cells are configured or operated through shared word lines during the second time period.

Figure 11:
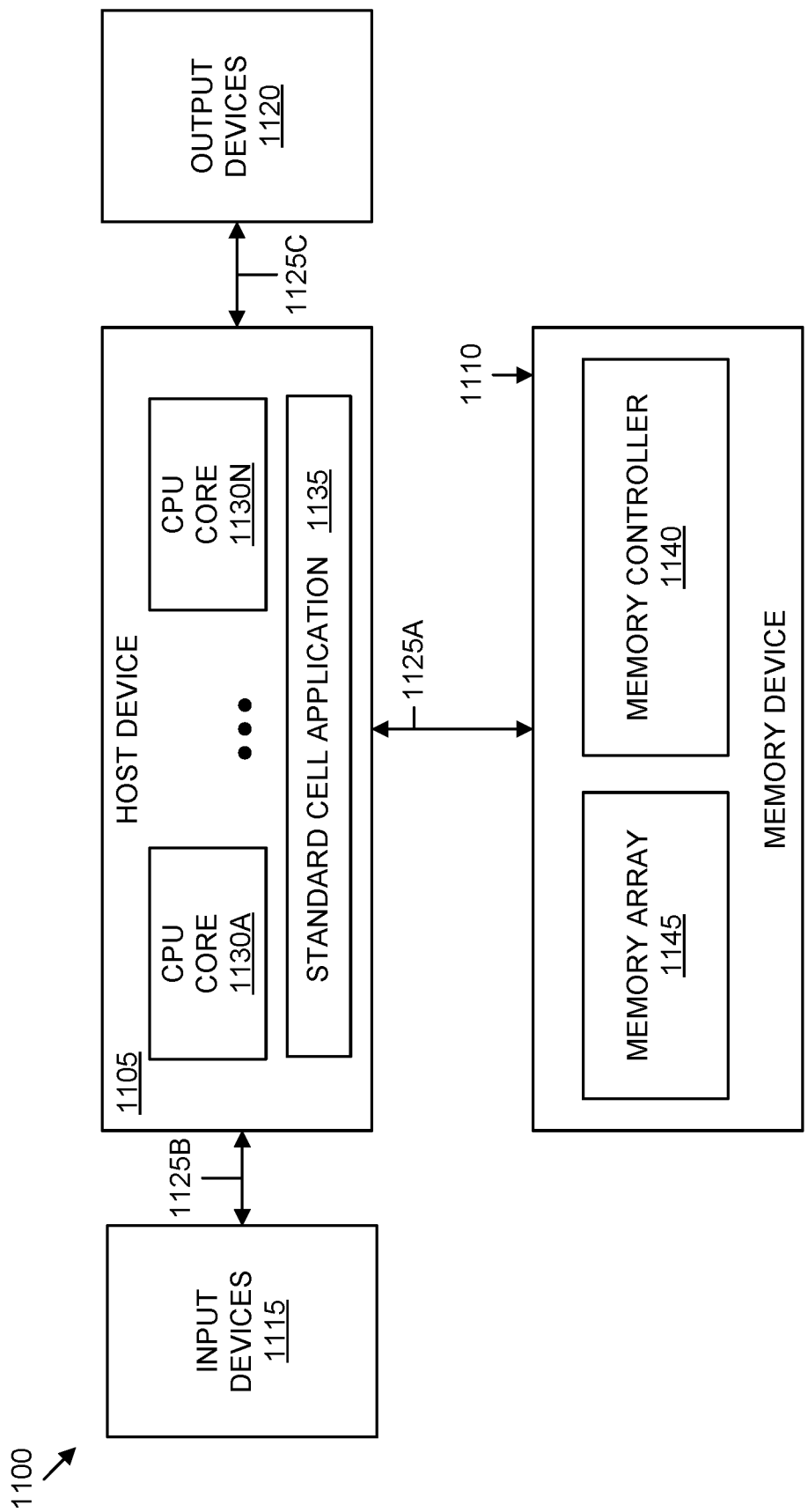
FIG. 11 is an example block diagram of a computing system, in accordance with some embodiments.

Referring now to FIG. 11, an example block diagram of a computing system 1100 is shown, in accordance with some embodiments of the disclosure. The computing system 1100 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 1100 includes a host device 1105 associated with a memory device 1110. The host device 1105 may be configured to receive input from one or more input devices 1115 and provide output to one or more output devices 1120. The host device 1105 may be configured to communicate with the memory device 1110, the input devices 1115, and the output devices 1120 via appropriate interfaces 1125A, 1125B, and 1125C, respectively. The computing system 1100 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 1105.

The input devices 1115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 1105 and that allows an external source, such as a user (e.g., a circuit or layout designer), to enter information (e.g., data) into the host device and send instructions to the host device. Similarly, the output devices 1120 may include a variety of output technologies such as external memories, printers, speakers, displays, microphones, light emitting diodes, headphones, video devices, and any other output peripherals that are configured to receive information (e.g., data) from the host device 1105. The "data" that is either input into the host device 1105 and/or output from the host device may include any of a variety of textual data, circuit data, signal data, semiconductor device data, graphical data, combinations thereof, or other types of analog and/or digital data that is suitable for processing using the computing system 1100.

The host device 1105 includes or is associated with one or more processing units/processors, such as Central Processing Unit ("CPU") cores 1130A-1130N. The CPU cores 1130A-1130N may be implemented as an Application Specific Integrated Circuit ("ASIC"), Field Programmable Gate Array ("FPGA"), or any other type of processing unit. Each of the CPU cores 1130A-1130N may be configured to execute instructions for running one or more applications of the host device 1105. In some embodiments, the instructions and data to run the one or more applications may be stored within the memory device 1110. The host device 1105 may also be configured to store the results of running the one or more applications within the memory device 1110. Thus, the host device 1105 may be configured to request the memory device 1110 to perform a variety of operations. For example, the host device 1105 may request the memory device 1110 to read data, write data, update or delete data, and/or perform management or other operations. One such application that the host device 1105 may be configured to run may be a standard cell application 1135. The standard cell application 1135 may be part of a computer aided design or electronic design automation software suite that may be used by a user of the host device 1105 to use, create, or modify a standard cell of a circuit. In some embodiments, the instructions to execute or run the standard cell application 1135 may be stored within the memory device 1110. The standard cell application 1135 may be executed by one or more of the CPU cores 1130A-1130N using the instructions associated with the standard cell application from the memory device 1110. In one example, the standard cell application 1135 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 11, the memory device 1110 includes a memory controller 1140 that is configured to read data from or write data to a memory array 1145. The memory array 1145 may include a variety of volatile and/or non-volatile memories. For example, in some embodiments, the memory array 1145 may include NAND flash memory cores. In other embodiments, the memory array 1145 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 1145 may be individually and independently controlled by the memory controller 1140. In other words, the memory controller 1140 may be configured to communicate with each memory within the memory array 1145 individually and independently. By communicating with the memory array 1145, the memory controller 1140 may be configured to read data from or write data to the memory array in response to instructions received from the host device 1105. Although shown as being part of the memory device 1110, in some embodiments, the memory controller 1140 may be part of the host device 1105 or part of another component of the computing system 1100 and associated with the memory device. The memory controller 1140 may be implemented as a logic circuit in either software, hardware, firmware, or combination thereof to perform the functions described herein. For example, in some embodiments, the memory controller 1140 may be configured to retrieve the instructions associated with the standard cell application 1135 stored in the memory array 1145 of the memory device 1110 upon receiving a request from the host device 1105.

It is to be understood that only some components of the computing system 1100 are shown and described in FIG. 11. However, the computing system 1100 may include other components such as various batteries and power sources, networking interfaces, routers, switches, external memory systems, controllers, etc. Generally speaking, the computing system 1100 may include any of a variety of hardware, software, and/or firmware components that are needed or considered desirable in performing the functions described herein. Similarly, the host device 1105, the input devices 1115, the output devices 1120, and the memory device 1110 including the memory controller 1140 and the memory array 1145 may include other hardware, software, and/or firmware components that are considered necessary or desirable in performing the functions described herein.

One aspect of this description relates to a memory array. In some embodiments, the memory array includes a first set of memory cells including a first subset of memory cells and a second subset of memory cells. In some embodiments, the first subset of memory cells is connected between a first local bit line and a first local select line extending along a first direction. In some embodiments, the second subset of memory cells is connected between a second local bit line and a second local select line extending along the first direction. In some embodiments, the memory array includes a first switch connected between the first local bit line and a first global bit line. In some embodiments, the first global bit line extends along a second direction. In some embodiments, the memory array includes a second switch connected between the second local bit line and the first global bit line.

One aspect of this description relates to a system. In some embodiments, the system includes a memory array and a controller. In some embodiments, the memory array includes a first set of memory cells including a first subset of memory cells connected between a first local bit line and a first local select line extending along a first direction. In some embodiments, the memory array includes a second set of memory cells including a second subset of memory cells connected between a second local bit line and a second local select line extending along the first direction. In some embodiments, the memory array includes a first switch connected between the first local bit line and a first global bit line. In some embodiments, the memory array includes a second switch connected between the second local bit line and a second global bit line. In some embodiments, the first global bit line and the second global bit line extend along a second direction. In some embodiments, a gate electrode of the first switch and a gate electrode of the second switch are electrically coupled to a first switch control line extending along a third direction. In some embodiments, the controller is electrically coupled to the memory array through the first global bit line, the second global bit line, and the first switch control line. In some embodiments, the controller is to apply a signal to the first switch control line during a first time period to enable the first switch and the second switch during the first time period.

One aspect of this description relates to a method of operating or configuring a memory array. In some embodiments, the method includes applying, by a memory controller during a first time period, a first signal having a first state to a first switch control line extending along a first direction to enable a first switch during the first time period. In some embodiments, the first switch control line is electrically coupled to a gate electrode of the first switch. In some embodiments, the first switch is connected between a first global bit line and a first local bit line. In some embodiments, a first subset of memory cells is connected between the first local bit line and a first local select line. In some embodiments, the first global bit line extends along a second direction. In some embodiments, the first local bit line and the first local select line extend along a third direction. In some embodiments, the method includes applying, by the memory controller during the first time period, a second signal having a second state to a second switch control line extending along the first direction to disable a second switch during the first time period. In some embodiments, the second switch control line is electrically coupled to a gate electrode of the second switch. In some embodiments, the second switch is connected between the first global bit line and a second local bit line. In some embodiments, a second subset of memory cells is connected between the second local bit line and a second local select line. In some embodiments, the second local bit line and the second local select line extend along the third direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a first set of memory cells including:
        a first subset of memory cells connected between a first local bit line and a first local select line; and
        a second subset of memory cells connected between a second local bit line and a second local select line;
    a first switch connected between the first local bit line and a first global bit line; and
    a second switch connected between the second local bit line and the first global bit line,
    wherein the first switch is configured to selectively couple the first global bit line to the first subset of memory cells based on a first switch control line, and
    wherein the second switch is configured to selectively couple the first global bit line to the second subset of memory cells based on a second switch control line; and
    a second set of memory cells including:
        a third subset of memory cells connected between a third local bit line and a third local select line; and
        a fourth subset of memory cells connected between a fourth local bit line and a fourth local select line;
    a third switch connected between the third local bit line and a second global bit line; and
    a fourth switch connected between the fourth local bit line and the second global bit line,
    wherein a gate electrode of a first memory cell of the first subset of memory cells is connected to a gate electrode of a second memory cell of the second subset of memory cells through a first local word line; and
    wherein a gate electrode of a third memory cell of the first subset of memory cells is connected to a gate electrode of a fourth memory cell of the second subset of memory cells through a second local word line.

2. The memory device of claim 1, wherein the first to fourth local bit lines and the first to fourth local select lines each extend along a first direction, the first to second global bit lines each extend along a second direction, and the first switch control line and second switch control line each extend along a third direction.

3. The memory device of claim 2, wherein the first to third directions are orthogonal to one another.

4. The memory device of claim 2, wherein the first set of memory cells and the second set of memory cells are arranged with each other along the third direction.

5. The memory device of claim 2,
wherein the first local word line extends along the second direction; and
wherein the second local word line extends along the second direction.

6. The memory device of claim 5,
wherein a gate electrode of a fifth memory cell of the third subset of memory cells is connected to a gate electrode of a sixth memory cell of the fourth subset of memory cells through a third local word line extending along the second direction; and
wherein a gate electrode of a seventh memory cell of the third subset of memory cells is connected to a gate electrode of an eighth memory cell of the fourth subset of memory cells through a fourth local word line extending along the second direction.

7. The memory device of claim 6,
wherein the first local word line and the third local word line are connected to a first global word line extending along the third direction; and
wherein the second local word line and the fourth local word line are connected to a second global word line extending along the third direction.

8. The memory device of claim 1, wherein the third switch is configured to selectively couple the second global bit line to the third subset of memory cells based on the first switch control line, and the fourth switch is configured to selectively couple the second global bit line to the fourth subset of memory cells based on the second switch control line.

9. The memory device of claim 1, further comprising:
a third switch connected between the first local select line and a first global select line; and
a fourth switch connected between the second local select line and the first global select line.

10. A memory device, comprising:
a first set of memory cells including:
a first subset of memory cells connected between a first local bit line and a first local select line, each of the first local bit line and the first local select line extending along a first direction; and
a second subset of memory cells connected between a second local bit line and a second local select line, each of the second local bit line and the second local select line extending along the first direction;
a first switch connected between the first local bit line and a first global bit line, the first global bit line extending along a second direction; and
a second switch connected between the second local bit line and the first global bit line,
wherein the first switch is configured to selectively couple the first global bit line to the first subset of memory cells based on a first switch control line extending along a third direction, and
wherein the second switch is configured to selectively couple the first global bit line to the second subset of memory cells based on a second switch control line, extending along the third direction; and a second set of memory cells including:
a third subset of memory cells connected between a third local bit line and a third local select line extending along the first direction; and
a fourth subset of memory cells connected between a fourth local bit line and a fourth local select line extending along the first direction;
a third switch connected between the third local bit line and a second global bit line, wherein the second global bit line extends along the second direction; and
a fourth switch connected between the fourth local bit line and the second global bit line,
wherein a gate electrode of a first memory cell of the first subset of memory cells is connected to a gate electrode of a second memory cell of the second subset of memory cells through a first local word line; and
wherein a gate electrode of a third memory cell of the first subset of memory cells is connected to a gate electrode of a fourth memory cell of the second subset of memory cells through a second local word line.

11. The memory device of claim 10,
wherein a gate electrode of the third switch is electrically coupled to the first switch control line; and
wherein a gate electrode of the fourth switch is electrically coupled to the second switch control line.

12. The memory device of claim 11,
wherein the first local word line extends along the second direction; and
wherein the second local word line extends along the second direction.

13. The memory device of claim 12,
wherein a gate electrode of a fifth memory cell of the third subset of memory cells is connected to a gate electrode of a sixth memory cell of the fourth subset of memory cells through a third local word line extending along the second direction; and
wherein a gate electrode of a seventh memory cell of the third subset of memory cells is connected to a gate electrode of an eighth memory cell of the fourth subset of memory cells through a fourth local word line extending along the second direction.

14. The memory device of claim 13,
wherein the first local word line and the third local word line are connected to a first global word line extending along the third direction; and
wherein the second local word line and the fourth local word line are connected to a second global word line extending along the third direction.

15. The memory device of claim 10, further comprising:
a third switch connected between the first local select line and a first global select line, wherein the first global select line extends along the second direction; and
a fourth switch connected between the second local select line and the first global select line.

16. A memory device, comprising:
a first set of memory cells including:
a first subset of memory cells connected between a first local bit line and a first local select line, each of the first local bit line and the first local select line extending along a first direction; and
a second subset of memory cells connected between a second local bit line and a second local select line, each of the second local bit line and the second local select line extending along the first direction;
a first switch connected between the first local bit line and a first global bit line, the first global bit line extending along a second direction;

a second switch connected between the second local bit line and the first global bit line;

a second set of memory cells including:

a third subset of memory cells connected between a third local bit line and a third local select line extending along the first direction; and a fourth subset of memory cells connected between a fourth local bit line and a fourth local select line extending along the first direction;

wherein a gate electrode of a first memory cell of the first subset of memory cells is connected to a gate electrode of a second memory cell of the second subset of memory cells through a first local word line; and wherein a gate electrode of a third memory cell of the first subset of memory cells is connected to a gate electrode of a fourth memory cell of the second subset of memory cells through a second local word line.

17. The memory device of claim 16, wherein the first switch is configured to selectively couple the first global bit line to the first subset of memory cells based on a first switch control line extending along a third direction;

wherein the second switch is configured to selectively couple the first global bit line to the second subset of memory cells based on a second switch control line extending along the third direction;

wherein a third switch is configured to selectively couple a second global bit line to the third subset of memory cells based on the first switch control line; and wherein a fourth switch is configured to selectively couple the second global bit line to the fourth subset of memory cells based on the second switch control line.

18. The memory device of claim 16, wherein the first set of memory cells and the second set of memory cells are arranged with each other along the third direction.

\* \* \* \* \*